US008275089B2

United States Patent
Hu

(10) Patent No.: US 8,275,089 B2
(45) Date of Patent: Sep. 25, 2012

(54) SHIFT REGISTER AND GATE LINE DRIVING DEVICE

(75) Inventor: Ming Hu, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 171 days.

(21) Appl. No.: 12/887,688

(22) Filed: Sep. 22, 2010

(65) Prior Publication Data

US 2011/0075790 A1   Mar. 31, 2011

(30) Foreign Application Priority Data

Sep. 25, 2009  (CN) .......................... 2009 1 0093182

(51) Int. Cl.
*G11C 19/00*   (2006.01)
(52) U.S. Cl. ................. 377/64; 377/72; 377/74
(58) Field of Classification Search .............. 327/64, 327/72–74, 78, 79, 81
See application file for complete search history.

(56) References Cited

U.S. PATENT DOCUMENTS

| | | | |
|---|---|---|---|
| 5,596,617 A * | 1/1997 | Wolf et al. ................. 377/73 |
| 6,556,646 B1 | 4/2003 | Yeo et al. | |
| 7,406,146 B2 * | 7/2008 | Yu ................................... 377/64 |
| 2007/0192659 A1 | 8/2007 | Kang et al. | |
| 2007/0296681 A1 | 12/2007 | Kim et al. | |

FOREIGN PATENT DOCUMENTS

| KR | 10-0281336 B1 | 11/2000 |
| KR | 20070082139 A | 8/2007 |
| KR | 20080057601 A | 6/2008 |

OTHER PUBLICATIONS

Korean Intellectual Property Office Notice of Allowance of Patent dated Jul. 31, 2012; Appln. No. 10-2010-0092910.

* cited by examiner

*Primary Examiner* — Hai L Nguyen
(74) *Attorney, Agent, or Firm* — Ladas & Parry LLP

(57) ABSTRACT

It discloses a shift register and a gate line driving device, relating to the technology field for a liquid crystal display, it is made to reduce the switching on errors for gate lines and improve the quality of the image. Said shift register includes: a first thin film transistor, a second thin film transistor, a third thin film transistor, a storage capacitor, a feedback module, and a switch module, wherein said feedback module is used to receive a trigger signal of the feedback module of the previous stage and a clock signal in order to pull up the level of the first node Qa as a pull up node, and to output a feedback signal to the shift register of the previous stage and output a trigger signal to the feedback module of the next stage, said switch module is used to maintain the output terminal of the shift register of the present stage at a low level when the shift register of the present stage does not operate. An embodiment of the present invention is applied to a liquid crystal display panel.

18 Claims, 10 Drawing Sheets

SHIFT REGISTER AND GATE LINE DRIVING DEVICE

BACKGROUND

An embodiment of the present invention relates to a technology field for a liquid crystal display, and to a shift register and a gate line driving device thereof.

A pixel array of a liquid crystal display includes a multiple rows of gate lines and a multiple columns of data lines which are interlaced. Wherein, a gate line driving device consisted of a plurality of shift registers provides a switch signal for the multiple rows of gate lines of pixel array, thereby controlling the multiple rows of gate lines being switched on in order, and the pixel electrodes in the pixel array are charged by the corresponding row of data lines, in order to form a gray voltage required for displaying each gray scale of an image, and then display each frame of image.

As shown in FIG. 1, the existing gate line driving device includes a plurality of shift registers, wherein a output OUTN of the Nth stage of shift register is not only fed back to the (N−1)th stage of shift register to switch off the (N−1)th stage of shift register, but also outputted to the (N+1)th stage of shift register as a trigger signal for the (N+1)th stage of shift register. While as shown in FIG. 2, when a output of one stage of shift register is used as the trigger signal of another stage of shift register, since the load connected with the output terminal is large, a signal approximating a square wave at the input terminal will be delayed at the output terminal, a phenomenon of two sequential rows of gate lines being concurrently switched on will happen when the delay is large, also the pixel array will generate interference with the output terminal, thereby making the stability for the signal of the output terminal insufficient, which all easily generate a read/write error, therefore affecting the quality of the image.

Moreover, when the output of one stage of shift register is used as the trigger signal of another stage of shift register, clock signals CLK, CLKB need be triggered synchronously with the output, as shown in FIG. 3, so a duty ratio for the clock signals CLK, CLKB need to be maintained as 50%, which makes no reserved spare time between the driving of the two rows of gate line, thus it can not ensure that another stage of shift register will not be switched on until one stage of the shift register has been switched off sufficiently, therefore it will also cause two continuous rows of gate lines being concurrently switched on, thus making the signal crosstalk happened, eventually affecting the quality of the image.

SUMMARY

The technical problem to be solved by an embodiment of the present invention is to provide a shift register, capable of reducing the error for gate line switching on, so as to improve the quality of an image.

To address said technical problem, an embodiment of the present invention adopts the following technical solution.

A shift register, comprising:

a first thin film transistor, whose gate is connected to a first node as a pull-up node, a source thereof is connected to a clock signal terminal, a drain thereof is connected to a output terminal of the present stage;

a second thin film transistor, whose gate is connected to a feedback signal terminal of the next stage, a source thereof is connected to said first node, a drain thereof is connected to a low level signal terminal;

a third thin film transistor, whose gate is connected to a feedback signal terminal of the next stage, a source thereof is connected to a second node as a pull-down node, a drain thereof is connected to the low level signal terminal, wherein, the second node is connected with the output terminal of the present stage;

a capacitor, connected between said first node and the output terminal of the present stage;

a feedback module, connected between the trigger signal terminal of the previous stage, the clock signal terminal and said first node, and connected to the feedback signal terminal of the present stage and the trigger signal terminal of the present stage;

a switch module, connected with the clock signal terminal, said feedback module and the output terminal of the present stage, and connected to the low level signal terminal;

wherein said feedback module is used to receive a trigger signal of the feedback module of the previous stage and the clock signal in order to pull up the level of the first node, and to output feedback signal to the shift register of the previous stage and output the trigger signal to the feedback module of the next stage, said switch module is used to maintain the output terminal of the shift register of the present stage at a low level when the shift register of the present stage does not operate.

According to the shift register provided by an embodiment of the present invention, through the feedback module, an intermediate signal of said shift register can be outputted to the shift register of the previous stage as a feedback signal, and to the shift register of the next stage as a trigger signal. In this way, on one hand, said intermediate signal does not require driving a load, and thus the delay thereof is small. Also said intermediate signal would not suffer the interference of the pixel array, and has a stronger stability. On the other hand, since the output signal of the shift register is not adopted as said feedback signal and said trigger signal, there is no need for the output signal and the clock signal to keep synchronized, so that the duty ratio of the clock signal could be reduced, and also a spare time between the driving of the two rows of gate line could be reserved. The above two aspects would both be better to avoid the phenomenon of two consecutive rows of gate lines being concurrently switched on, thus it can reduce the switching on errors for gate lines and improve the quality of the image.

The other technical problem to be solved by an embodiment of the present invention is to provide a gate line driving device, capable of reducing the error for gate line switching on, so as to improve the quality of an image.

To address said technical problem, an embodiment of the present invention adopts the following technical solution.

A gate line driving device comprising a plurality of shift registers connected in series, said shift register comprising:

a first thin film transistor, whose gate is connected to a first node as a pull-up node, a source thereof is connected to a clock signal terminal, a drain thereof is connected to a output terminal of the present stage;

a second thin film transistor, whose gate is connected to a feedback signal terminal of the next stage, a source thereof is connected to said first node, a drain thereof is connected to a low level signal terminal;

a third thin film transistor, whose gate is connected to a feedback signal terminal of the next stage, a source thereof is connected to a second node as a pull-down node, a drain thereof is connected to the low level signal terminal, wherein the second node is connected with the output terminal of the present stage;

a capacitor, connected between said first node and the output terminal of the present stage;

a feedback module, connected between the trigger signal terminal of the previous stage, the clock signal terminal and said first node, and connected to the feedback signal terminal of the present stage and the trigger signal terminal of the present stage;

a switch module, connected with the clock signal terminal, said feedback module and the output terminal of the present stage, and connected to the low level signal terminal;

wherein said feedback module is used to receive a trigger signal of the feedback module of the previous stage and the clock signal in order to pull up the level of the first node, and to output feedback signal to the shift register of the previous stage and output the trigger signal to the feedback module of the next stage, said switch module is used to maintain the output terminal of the shift register of the present stage at a low level when the shift register of the present stage does not operate.

In the gate line driving device provided by an embodiment of the present invention, as for the shift register thereof, through the feedback module, an intermediate signal of said shift register can be outputted to the shift register of the previous stage as a feedback signal, and to the shift register of the next stage as a trigger signal. In this way, on the one hand said intermediate signal does not need driving a load and thus the delay thereof is small, also said intermediate signal would not suffer the interference of the pixel array, and has a strong stability. On the other hand, since the output signal of the shift register is not adopted as said feedback signal and said trigger signal, there is no need for the output signal and the clock signal to keep synchronized, so that the duty ratio of the clock signal could be reduced, and also spare time between driving of the two rows of gate line could be reserved. The above two aspects would both be better to avoid the phenomenon of two consecutive rows of gate lines being concurrently switched on, thus it can reduce the switching on errors for gate lines and improve the quality of the image.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

An embodiment of the present invention aims to provide a shift register and a gate line driving device thereof, capable of reducing the error for gate line switching on, so as to improve the quality of an image.

Embodiments of the present invention are described in details below in connection with the accompany figures and the embodiments.

Figure 1:
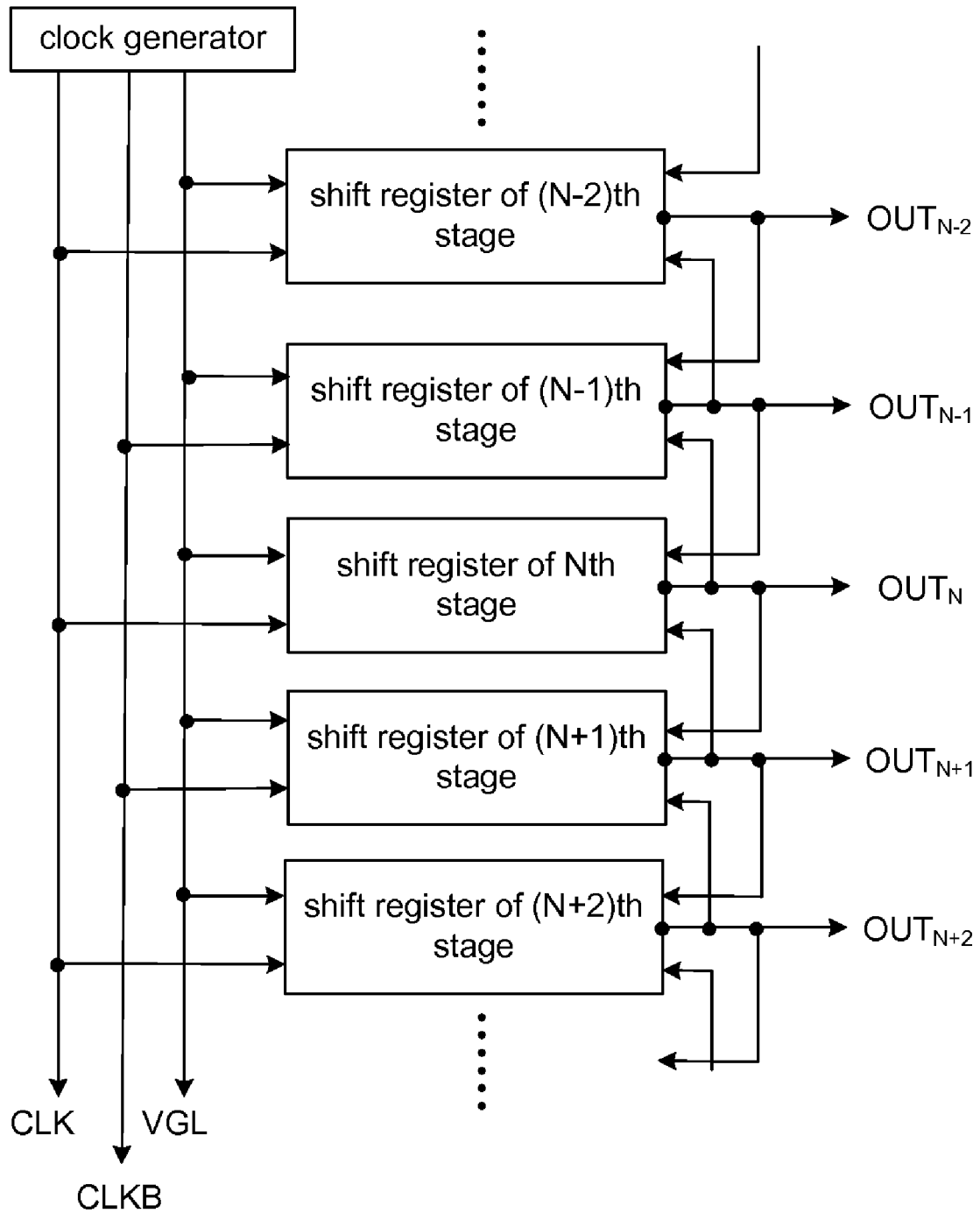
FIG. 1 is a schematic diagram of a gate line driving device of the prior art.
Figure 2:
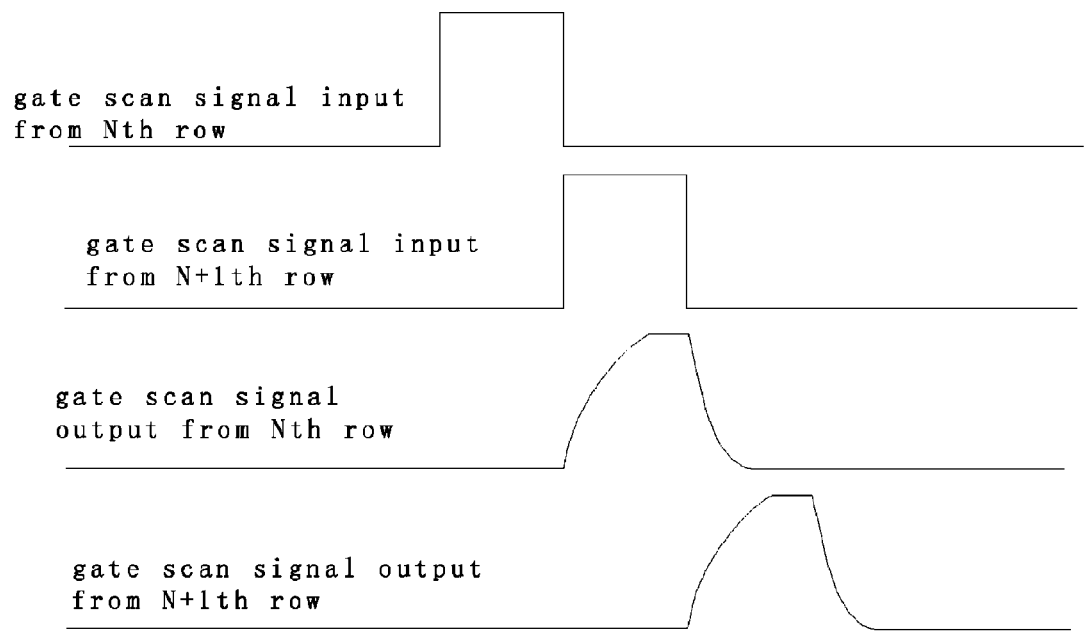
FIG. 2 is a schematic diagram of a input signal and a output signal for gate line driving of the prior art.
Figure 3:
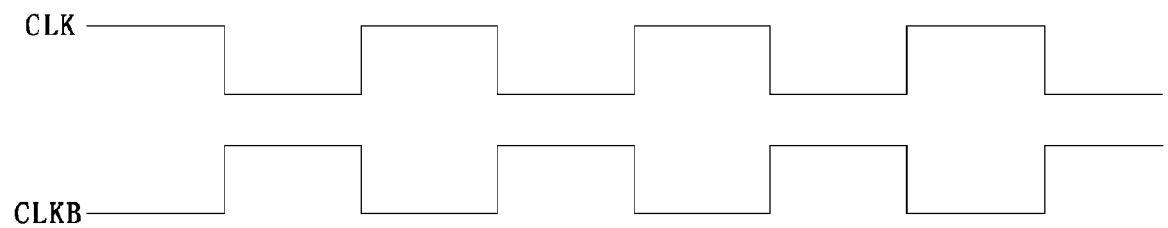
FIG. 3 is a schematic diagram of a clock signal of the prior art.
Figure 4:
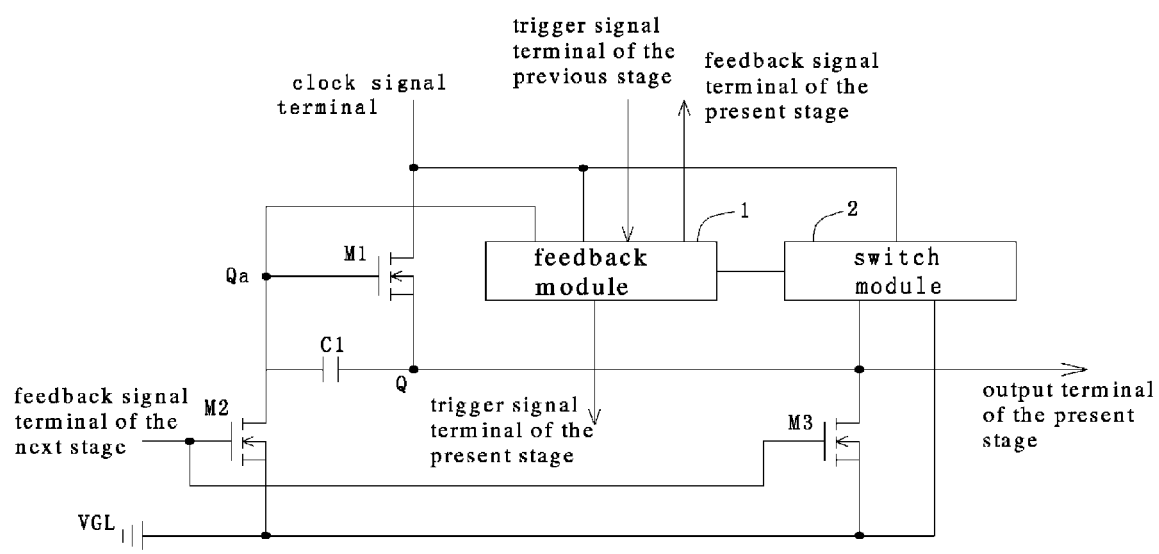
FIG. 4 is a schematic diagram of a shift register of an embodiment of the present invention.

As shown in FIG. 4, the shift register of an embodiment of the present invention includes three thin film transistors of hydrogenated amorphous silicon type, one storage capacitor, one feedback module, one switch module and the corresponding input and output terminals. The shift register comprises: a first thin film transistor M1, with a gate connected to a first node Qa as a pull-up node, a source connected to a clock signal terminal, and a drain connected to a output terminal of the present stage, the first thin film transistor M1 is used to control the shift register to start operation, when the first node Qa connected to its gate is at high level and its source receives a high level signal; a second thin film transistor M2, with a gate connected to a feedback signal terminal of the next stage, a source connected to said first node Qa, and a drain connected to a low level signal terminal, the second thin film transistor M2 is used to maintain the first node Qa at low level when the feedback signal of the next stage is at high level, thereby maintaining the gate of the first thin film transistor M1 at a low level; a third thin film transistor M3, with a gate connected to a feedback signal terminal of the next stage, a source connected to a second node Q as a pull-down node (wherein the second node Q is connected with the output terminal of the present stage), and a drain connected to the low level signal terminal, the third thin film transistor M3 is used to maintain the second node Q at low level when the feedback signal of the next stage is at high level, thereby maintaining the output terminal of the present stage at a low level; a capacitor C1, connected between said first node Qa and the output terminal of the present stage; a feedback module 1, connected between the trigger signal terminal of the previous stage, the clock signal terminal and the first node Qa, and connected to the feedback signal terminal of the present stage and the trigger signal terminal of the present stage; a switch module 2, connected with the clock signal terminal, feedback module 1 and the output terminal of the present stage, and connected to the low level signal terminal; wherein feedback module 1 is used to receive a trigger signal of the feedback module of the previous stage and the clock signal, in order to pull up the level of the first node Qa, and to output feedback signal to the shift register of the previous stage and output the trigger signal to the feedback module of the next stage. Switch module 2 is used to maintain the output terminal of the shift register of the present stage at a low level when the shift register of the present stage does not operate.

In the shift register provided in an embodiment of the present invention, by feedback module 1, an intermediate signal of said shift register can be outputted to the shift register of the previous stage as a feedback signal, and to the shift register of the next stage as a trigger signal in this way, on one hand said intermediate signal does not need driving a load and thus the delay thereof is small, also said intermediate signal would not suffer the interference of the pixel array, with a strong stability. On the other hand, since the output signal of the shift register is not adopted as said feedback signal and said trigger signal, there is no need for the output signal and the clock signal to keep synchronized, so that the duty ratio of the clock signal could be reduced, and also spare time between the driving of the two rows of gate line could be reserved. The above two aspects would both be in a better situation to avoid the phenomenon of two consecutive rows of gate lines being concurrently switched on, thus it can reduce the switching on errors for gate lines and improve the quality of the image.

Figure 5:
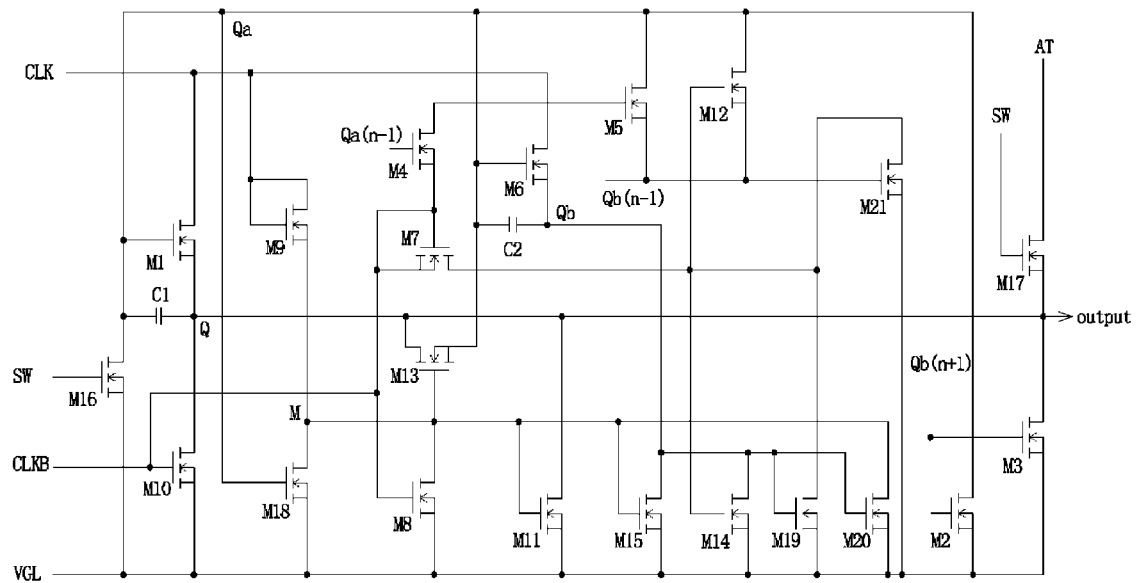
FIG. 5 is a schematic diagram of a shift register according to an embodiment of the present invention.

FIG. 5 is a structural schematic diagram of a shift register according to an embodiment of the present invention. In this embodiment, said shift register includes 21 thin film transistors of hydrogenated amorphous silicon type, one storage capacitor and the corresponding input terminals and output terminals. The 21 thin film transistors of hydrogenated amorphous silicon type are: a first thin film transistor M1, a second thin film transistor M2, a third thin film transistor M3, a fourth thin film transistor M4, a fifth thin film transistor M5, a sixth thin film transistor M6, a seventh thin film transistor M7, a eighth thin film transistor M8, a ninth thin film transistor M9, a tenth thin film transistor M10, a eleventh thin film transistor M11, a twelfth thin film transistor M12, a thirteenth thin film transistor M13, a fourteenth thin film transistor M14, a fifteenth thin film transistor M15, a sixteenth thin film transistor M16, a seventeenth thin film transistor M17, a eighteenth thin film transistor M18, a nineteenth thin film transistor M19, a twentieth thin film transistor M20 and a twenty-first thin film transistor M21, respectively. The storage capacitor is capacitor C1. The input and output terminals include a output terminal "output" of the present stage output, a first clock signal terminal CLK and a second clock signal terminal CLKB periodic alternatively used, a first trigger signal terminal Qa(n−1) and a second trigger signal terminal Qb(n−1) receiving the trigger signal of the shift register of the previous stage, a feedback signal terminal Qb(n+1) of the next stage, a low level signal terminal VGL, a switch signal terminal SW, and a reset signal terminal AT.

In particular, in the first thin film transistor M1, a gate thereof is connected to a first node Qa as a pull-up node, a source thereof is connected to the first clock signal terminal CLK, a drain thereof is connected to the output terminal "output" of the present stage; in the second thin film transistor M2, a gate thereof is connected to the feedback signal terminal Qb(n+1) of the next stage, a source thereof is connected to the first node Qa, a drain thereof is connected to the low level signal terminal VGL; in the third thin film transistor M3, a gate thereof is connected to the feedback signal terminal Qb(n+1) of the next stage, a source thereof is connected to the second node Q as a pull down node (wherein the second node Q is connected with the output terminal "output" of the present stage), a drain thereof is connected to the low level signal terminal VGL; in the fourth thin film transistor M4, a gate thereof is connected to the first trigger signal terminal Qa(n−1) receiving the trigger signal of the shift register of the previous stage, a source thereof is connected to a gate of the fifth thin film transistor M5, a drain thereof is connected to the second clock signal terminal CLKB; in the fifth thin film transistor M5, the gate thereof is connected to the source of the fourth thin film transistor M4, a source thereof is connected to the first node Qa, a drain thereof is connected to the second trigger signal terminal Qb(n−1) receiving the trigger signal of the shift register of the previous stage; in the sixth thin film transistor M6, a gate thereof is connected to the first node Qa, a source thereof is connected to the first clock signal terminal CLK, a drain thereof is connected to a third node Qb as a feedback node of the present stage; in the seventh thin film transistor M7, a gate and a drain thereof are connected together to the second clock signal terminal CLKB, a source thereof is connected to a gate of the twelfth thin film transistor M12 and a gate of the fourteenth thin film transistor M14; in the eighth thin film transistor M8, a gate thereof is connected to the second clock signal terminal CLKB, a source thereof is connected to a fourth node M as a interlocking node, a drain thereof is connected to the low level signal terminal VGL; in the ninth thin film transistor M9, a gate and a source thereof are connected together to the first clock signal terminal CLK, a drain thereof is connected to the fourth node M; in the tenth thin film transistor M10, a gate thereof is connected to the second clock signal terminal CLKB, a source thereof is connected to the second node Q, a drain thereof is connected to the low level signal terminal VGL; in the eleventh thin film transistor M11, a gate thereof is connected to the fourth node M, a source thereof is connected to the second node Q, a drain thereof is connected to the low level signal terminal VGL; in the twelfth thin film transistor M12, a gate thereof is connected to the source of the seventh thin film transistor M7, a source thereof is connected to the first node Qa, a drain thereof is connected to the second trigger signal terminal Qb(n−1) of the shift register of the previous stage; in the thirteenth thin film transistor M13, a gate thereof is connected to the fourth node M, a source thereof is connected to the second node Q, a drain thereof is connected to the first node Qa; in the fourteenth thin film transistor M14, a gate thereof is connected to the source of the seventh thin film transistor M7, a source thereof is connected to the third node Qb, a drain thereof is connected to the low level signal terminal VGL; in the fifteenth thin film transistor M15, a gate thereof is connected to the fourth node M, a source thereof is connected to the third node Qb, a drain thereof is connected to the low level signal terminal VGL; in the sixteenth thin film transistor M16, a gate thereof is connected to the switch signal terminal SW, a source thereof is connected to the first node Qa, a drain thereof is connected to the low level signal terminal VGL; in the seventeenth thin film transistor M17, a gate thereof is connected to the switch signal terminal SW, a source thereof is connected to the reset signal terminal AT, a drain thereof is connected to the second node Q; in the eighteenth thin film transistor M18, a gate thereof is connected to the first node Qa, a source thereof is connected to the fourth node M, a drain thereof is connected to the low level signal terminal VGL; in the nineteenth thin film transistor M19, a gate thereof is connected to the third node Qb, a source thereof is connected to the source of the seventh thin film transistor M7, a drain thereof is connected to the low level signal terminal VGL; in the twentieth thin film transistor M20, a gate thereof is connected to the third node Qb, a source thereof is connected to the fourth node M, a drain thereof is connected to the low level signal terminal VGL; in the twenty-first thin film transistor M21, a gate thereof is connected to the second trigger signal terminal Qb(n−1) of the shift register of the previous stage, a source thereof is connected to the source of the seventh thin film transistor M7, a drain thereof is connected to the low level signal terminal VGL. The storage capacitor C1 is connected between the first node Qa and the output terminal "output" of the present stage.

The fourth thin film transistor M4, the fifth thin film transistor M5 and the sixth thin film transistor M6 constitute the feedback module of the present embodiment, the feedback module is used to output an intermediate signal of said shift register to the shift register of the previous stage as a feedback signal, and output the intermediate signal to the shift register of the next stage as a trigger signal. In this way, on one hand said intermediate signal does not need driving a load and thus the delay thereof is small, also said intermediate signal would not suffer the interference of the pixel array, with a strong stability. On the other hand, since the output signal of said shift register is not adopted as said feedback signal and said trigger signal, there is no need for the output signal and the clock signal to keep synchronized, so that the duty ratio of the clock signal could be reduced, and also spare time between the driving of the two rows of gate line could be reserved. The above two aspects would both be better to avoid the phenomenon of two consecutive rows of gate lines being concurrently switched on, thus it can reduce the switching on errors for gate lines and improve the quality of the image.

In addition, the tenth thin film transistor M10 and the eleventh thin film transistor M11 described above constitute the first switch module, which is used to maintain the output terminal "output" of the present stage at a low level when the shift register of the present stage does not operate, so as to avoid the output terminal "output" of the present stage from becoming a high level under the effect of other interference signals, which would make its controlled row of gate line to be switched on due to the influence of the high level, and eventually make the gate line wrongly switched on. The tenth thin film transistor M10 is used to maintain the output terminal "output" of the present stage at a low level under the effect of the second clock signal CLKB, the eleventh thin film transistor M11 is used to maintain the output terminal "output" of the present stage at a low level under the effect of the first clock signal CLK.

The twelfth thin film transistor M12 and the thirteenth thin film transistor M13 described above constitute the second switch module, which is used to maintain the first node Qa at a low level when the shift register of the present stage does not operate, thus making the first thin film transistor M1 unable to switched on, which would further maintain the output terminal "output" of the present stage at a low level. The twelfth thin film transistor M12 is used to maintain the first node Qa at a low level under the effect of the second clock signal CLKB, and the thirteenth thin film transistor M13 is used to maintain the first node Qa at a low level under the effect of the first clock signal CLK.

The fourteenth thin film transistor M14 and the fifteenth thin film transistor M15 described above constitute the third switch module, which is used to maintain the third node Qb at a low level when the shift register of the present stage does not operate, thus making the feedback signal outputted to the shift register of the previous stage and the trigger signal outputted to the shift register of the next stage from the third node Qb at a low level, so as to avoid generating interference for the shift registers of the previous stage and the next stage. The fourteenth thin film transistor M14 is used to maintain the third node Qb at a low level under the effect of the second clock signal CLKB, and the fifteenth thin film transistor M15 is used to maintain the third node Qb at a low level under the effect of the first clock signal CLK.

The seventh thin film transistor M7, the eighth thin film transistor M8 and the ninth thin film transistor M9 described above constitute a class-1 switch module, which is used to control said first switch module, the second switch module and the third switch module. The term of "control" described herein means: to switch on or off respective switch modules, and make the thin film transistors in each switch module achieve interlocking under the effect of the first clock signal and the second clock signal, respectively.

At last, said first switch module, the second switch module, the third switch module and class-1 switch module are combined to constitute the switch module of the present embodiment. Said switch module is used to maintain the output terminal of the shift register of the present stage at a low level when the shift register of the present stage does not operate.

Further, as seen from FIG. 5, the shift register of the present stage further includes the sixteenth thin film transistor M16, whose gate is connected to the switch signal terminal SW, a source thereof is connected to first node Qa, a drain thereof is connected to the low level signal terminal VGL. The sixteenth thin film transistor M16 is only switched on at certain situation, such as a case where the shift register of the present stage need be shut down manually, thus the level of the first node Qa is pulled down, thus making the first thin film transistor M1 to be switched off, eventually it maintains the output terminal "output" of the present stage at a low level.

Furthermore, as also noted from FIG. 5, the shift register of the present stage further includes: the seventeenth thin film transistor M17, whose gate is connected to the switch signal terminal SW, a source thereof is connected to the reset signal terminal AT, a drain thereof is connected to the second node Q, i.e., the output terminal "output" of the present stage. Wherein, the seventeenth thin film transistor M17 is switched on under the effect of the switch signal SW, thus introducing the reset signal AT, which could shut down all of shift registers, in order to perform the screen clean for the liquid crystal display.

The eighteenth thin film transistor M18, the nineteenth thin film transistor M19, the twentieth thin film transistor M20 and the twenty-first thin film transistor M21 described above could assist the operation of the shift register of the present stage.

In practice, the technical solution of the present embodiment can not only be applied to thin film transistor of hydrogenated amorphous silicon type, but also to other type of thin film transistor.

It should be noted that, the above embodiment is only an implement of the shift register of an embodiment of the present invention, rather than limited thereto.

The operation process of the shift register of the present embodiment will be described below in connection with the shift register shown in FIG. 5 and together with the control timing sequence.

Figure 6:
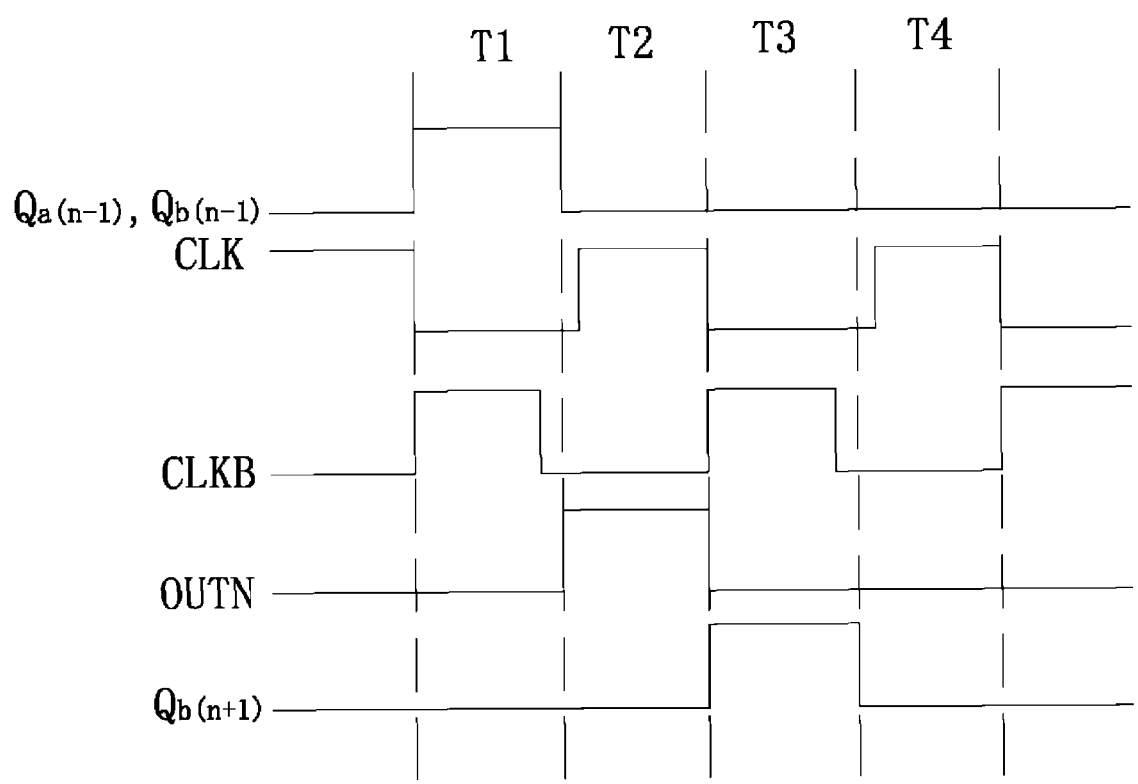
FIG. 6 is a schematic diagram of a signal of the shift register according to an embodiment of the present invention.

As shown in FIG. 6, which is a signal schematic diagram related to the present embodiment, it can be divided into four phases as T1, T2, T3 and T4.

In the T1 phase, Qa(n−1)=1, Qb(n−1)=1, CLK=0, CLKB=1, Qb(n+1)=0.

Figure 7:
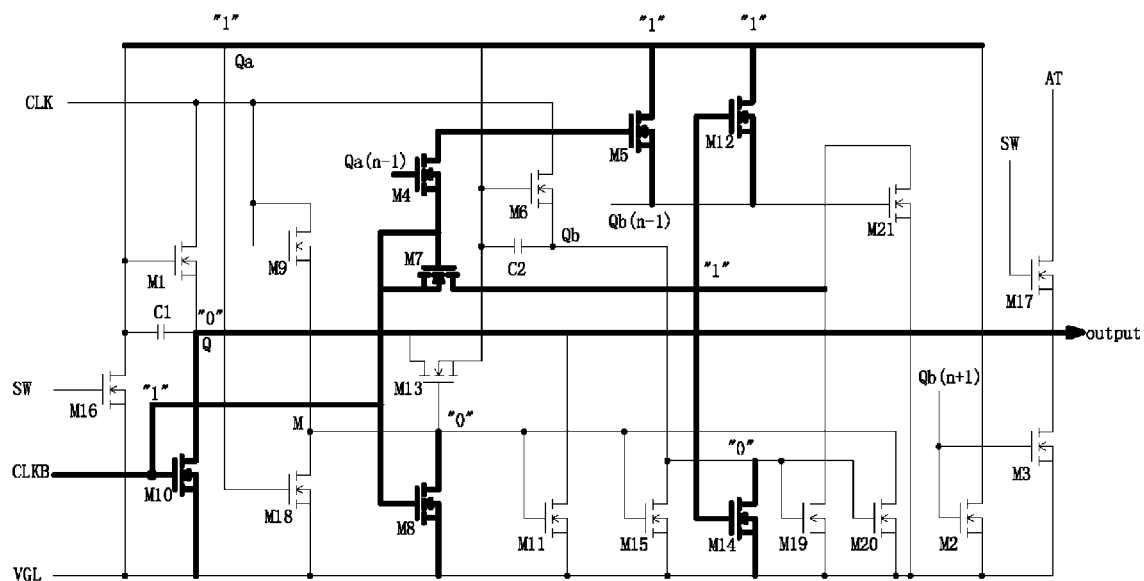
FIG. 7 is an operation schematic diagram in a T1 phase of the shift register shown in FIG. 4.

As shown by the bold part of FIG. 7, since Qa(n−1)=1, that is, the first trigger signal terminal is at high level, thus the fourth thin film transistor M4 is switched on, meanwhile, since CLKB=1, that is, the second clock signal is at high level, thus it enables the fifth thin film transistor M5 to be switched on, and since Qb(n−1)=1, that is, the second trigger signal terminal is at high level, the first node Qa is pulled up to a high level, that is, Qa=1, and it maintains the first node Qa at a high level by the storage capacitor C1. However since CLKB=1 at this time, the tenth thin film transistor M10 is switched on, thus it can still maintain the output terminal "output" of the present stage at a low level, i.e., OUTN=0. At this time, the shift register of the present stage is in a state of switched off.

In the T2 phase, Qa(n−1)=0, Qb(n−1)=0, CLK=1, CLKB=0, Qb(n+1)=0.

Figure 8:
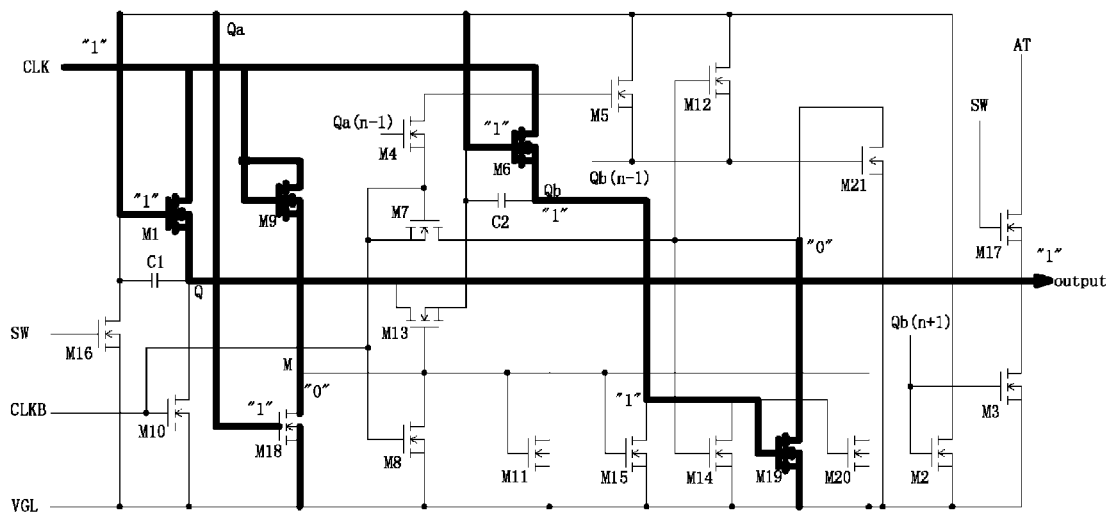
FIG. 8 is an operation schematic diagram in a T2 phase of the shift register shown in FIG. 4.

As shown by the bold part of FIG. 8, since Qa=1 in the T1 phase, thus the first thin film transistor M1 is switched on, at this time, since CLK=1, the output terminal "output" of the present stage becomes at a high level, i.e., OUTN=1. At this time, the shift register of the present stage is in a state of switched on. Meanwhile since the first node Qa=1, the sixth thin film transistor M6 is switched on, in addition to CLK=1, so the feedback node Qb becomes at a high level, i.e., Qb=1. In this phase, it can output two trigger signals to the shift register of the next stage through nodes Qa and Qb, the shift register of the next stage would be switched on under the effect of the those two trigger signals. Also, it could output a feedback signal to the shift register of the previous stage through node Qb, so as to close the shift register of the previous stage.

In the T3 phase, Qa(n−1)=0, Qb(n−1)=0, CLK=0, CLKB=1, Qb(n+1)=1.

Figure 9:
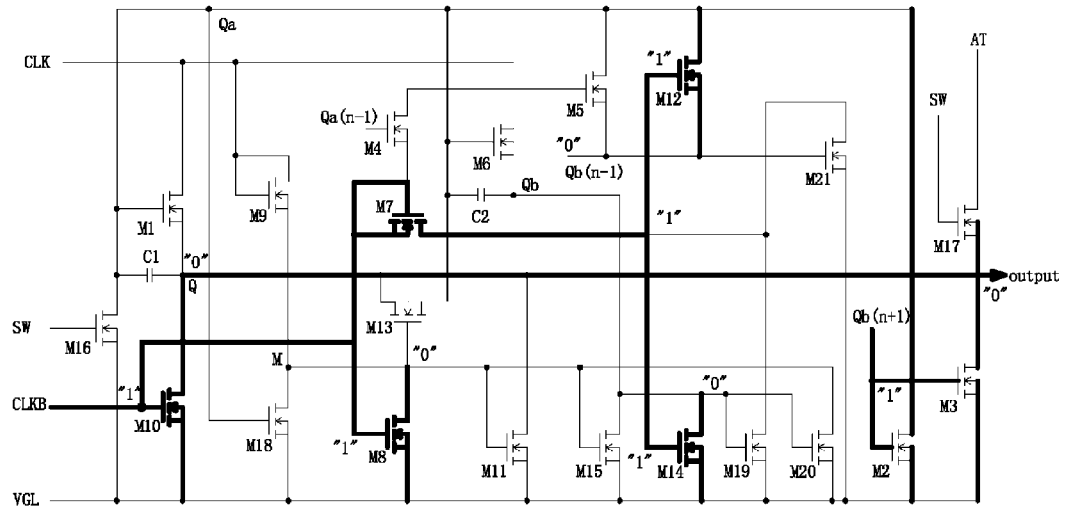
FIG. 9 is an operation schematic diagram in a T3 phase of the shift register shown in FIG. 4.

As shown by the bold part of FIG. 9, since Qb(n+1)=1, i.e., the feedback signal terminal of the next stage is at high level, at this time, it enables the second thin film transistor M2 and the third thin film transistor M3 to be switched on. Switching on the third thin film transistor M3 could enable the output terminal "output" of the present stage to become at a low level, that is, OUTN=0, at this time the shift register of the present stage is in a state of switched off. Switching on the second thin film transistor M2 could enable the first node Qa to become a low level, that is, Qa=0, which could make the first thin film transistor M1 maintain off, so it ensures the output terminal "output" of the present stage at a low level. Furthermore, since CLKB=1, it makes the seventh thin film transistor M7 to be switched on, thereby making the twelfth thin film transistor M12 and the fourteenth thin film transistor M14 switched on. Since Qb(n−1)=0 at this time, so it also enables the first node Qa to become at a low level after the switching on of the twelfth thin film transistor M12. And that since the fourteenth thin film transistor M14 is connected to the low level signal terminal VGL, after switching on the fourteenth thin film transistor M14, it can enable the third node Qb to become at a low level. Therefore the node Qa and Qb cannot trigger the shift register of the next stage to be switched on, and the shift register of the previous stage to be switched off.

In the T4 phase, Qa(n−1)=0, Qb(n−1)=0, CLK=1, CLKB=0, Qb(n+1)=0.

Figure 10:
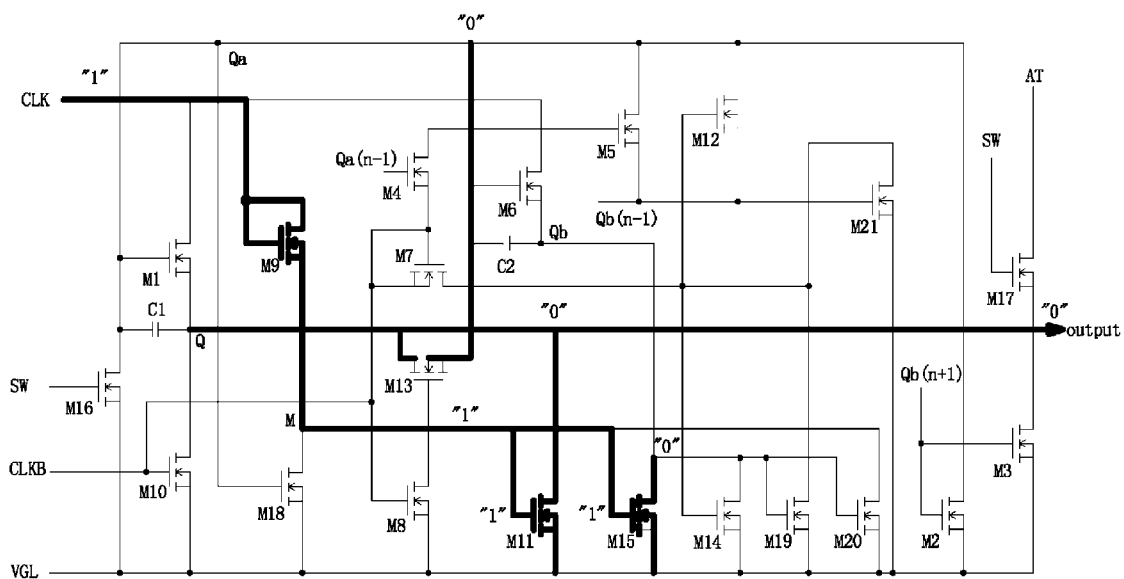
FIG. 10 is an operation schematic diagram in a T4 phase of the shift register shown in FIG. 4.

As shown by the bold part of FIG. 10, since CLK=1, the ninth thin film transistor M9 is switched on, thereby enabling the eleventh thin film transistor M11, the thirteenth thin film transistor M13 and the fifteenth thin film transistor M15 to be switched on. The eleventh thin film transistor M11 is connected to the low level signal terminal VGL, therefore it can maintain the output terminal "output" of the present stage at a low level, that is, OUTN=0, at this time the shift register of the present stage is in a state of switched off. And after the switching on of the thirteenth thin film transistor M13, it can enable the first node Qa to maintain a low level, and the third node Qb maintains a low level after switching on the fifteenth thin film transistor M15, which would further maintain the output terminal "output" of the present stage stably outputting a low level.

As noted from the above description, the shift register of the present embodiment can be much better to reduce the errors of switching on for the gate line, so as to improve the quality of the image.

Figure 11:
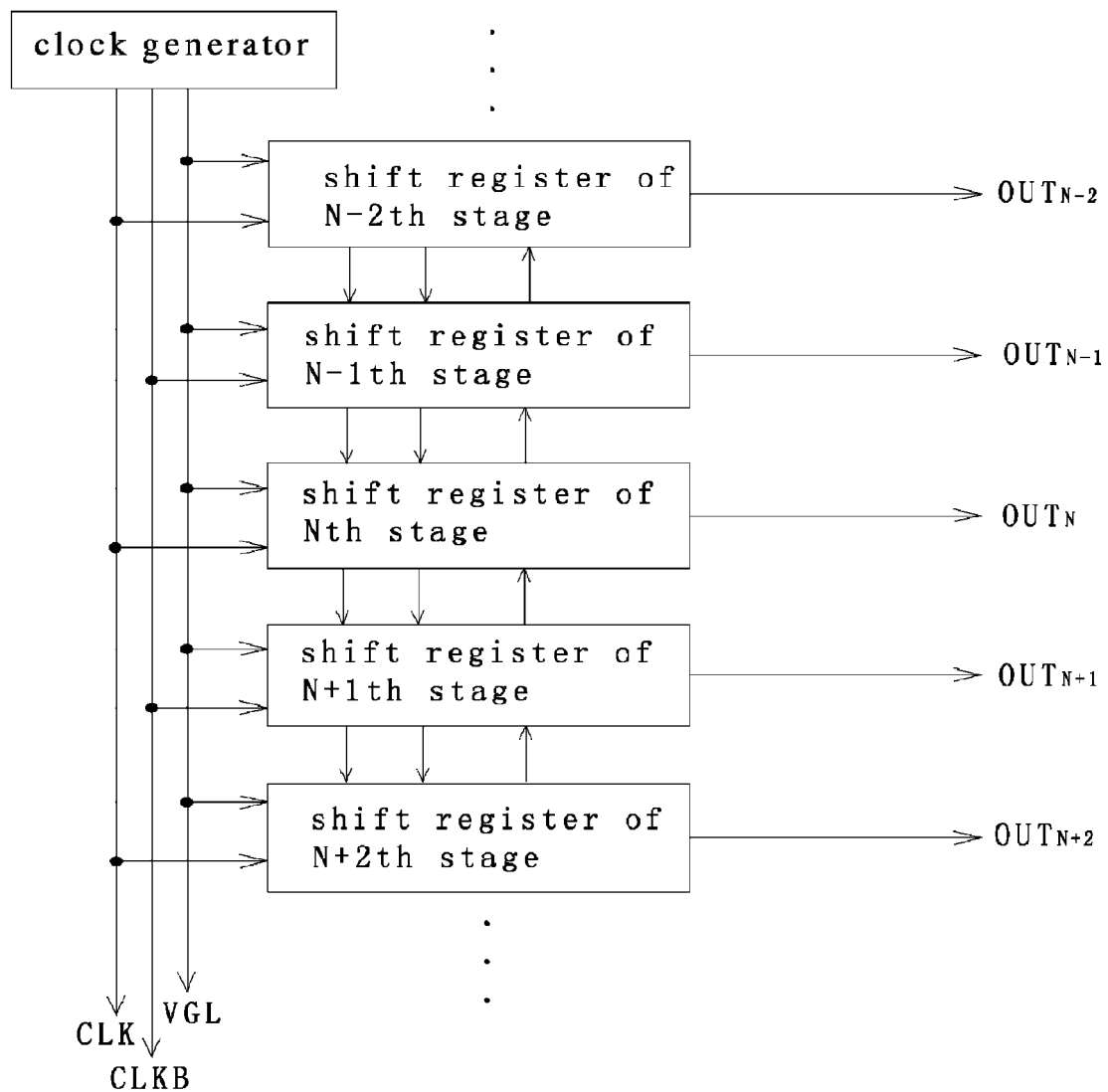
FIG. 11 is a schematic diagram of a gate line driving device according to an embodiment of the present invention.

In addition to that, an embodiment of the present invention also provides a gate line driving device, as shown in FIG. 11, the gate line driving device includes a plurality of shift registers connected in series, with reference to the FIG. 4, the shift register thereof includes three thin film transistors of hydrogenated amorphous silicon type, one storage capacitor, one feedback module, one switch module and the corresponding input and output terminals. The shift register comprises: a first thin film transistor M1, with a gate connected to a first node Qa as a pull-up node, a source connected to a clock signal terminal, and a drain connected to a output terminal of the present stage, the first thin film transistor M1 is used to control the shift register to start operation, when the first node Qa connected to its gate is at high level and its source receives a high level signal; a second thin film transistor M2, with a gate connected to a feedback signal terminal of the next stage, a source connected to said first node Qa, and a drain connected to a low level signal terminal, the second thin film transistor M2 is used to maintain the first node Qa at low level when the feedback signal of the next stage is at high level, thereby maintaining the gate of the first thin film transistor M1 at a low level; a third thin film transistor M3, with a gate connected to a feedback signal terminal of the next stage, a source connected to a second node Q as a pull-down node (wherein the second node Q is connected with the output terminal of the present stage), and a drain connected to the low level signal terminal, the third thin film transistor M3 is used to maintain the second node Q at low level when the feedback signal of the next stage is at high level, thereby maintaining the output terminal of the present stage at a low level; a capacitor C1, connected between said first node Qa and the output terminal of the present stage; a feedback module 1, connected between the trigger signal terminal of the previous stage, the clock signal terminal and the first node Qa, and connected to the feedback signal terminal of the present stage and the trigger signal terminal of the present stage; a switch module 2, connected with the clock signal terminal, feedback module 1 and the output terminal of the present stage, and connected to the low level signal terminal; wherein feedback module 1 is used to receive a trigger signal of the feedback module of the previous stage and the clock signal, in order to pull up the level of the first node Qa, and to output feedback signal to the shift register of the previous stage and output the trigger signal to the feedback module of the next stage. The switch module 2 is used to maintain the output terminal of the shift register of the present stage at a low level when the shift register of the present stage does not operate.

In the gate line driving device provided by an embodiment of the present invention, as for the shift register thereof, through the feedback module, an intermediate signal of said shift register can be outputted to the shift register of the previous stage as a feedback signal, and to the shift register of the next stage as a trigger signal. In this way, on the one hand said intermediate signal does not need driving a load and thus the delay thereof is small, also said intermediate signal would not suffer the interference of the pixel array, and has a strong stability. On the other hand, since the output signal of the shift register is not adopted as said feedback signal and said trigger signal, there is no need for the output signal and the clock signal to keep synchronized, so that the duty ratio of the clock signal could be reduced, and also spare time between driving of the two rows of gate line could be reserved. The above two aspects would both be better to avoid the phenomenon of two consecutive rows of gate lines being concurrently switched on, thus it can reduce the switching on errors for gate lines and improve the quality of the image.

It should be noted that, the structure and function of said shift register in the present embodiment is identical to that of the shift register in the embodiments described above, therefore the details of that is omitted herein.

The above descriptions are only the particular implements of an embodiment of the present invention, but the scope for protection of an embodiment of the present invention is not limited thereto. Anyone of those skilled in the art can easily make variations or replacement among the technical scope disclosed by an embodiment of the present invention, which are all included in the scope for protection of an embodiment of the present invention. Therefore, the scope of the invention is defined by that of the claims.

What is claimed is:

1. A shift register, comprising:
   a first thin film transistor, whose gate is connected to a first node as a pull-up node, a source thereof is connected to a clock signal terminal, a drain thereof is connected to a output terminal of the present stage;
   a second thin film transistor, whose gate is connected to a feedback signal terminal of the next stage, a source thereof is connected to said first node, a drain thereof is connected to a low level signal terminal;
   a third thin film transistor, whose gate is connected to a feedback signal terminal of the next stage, a source thereof is connected to a second node as a pull-down node, a drain thereof is connected to the low level signal terminal, wherein the second node is connected with the output terminal of the present stage;
   a capacitor, connected between said first node and the output terminal of the present stage;
   a feedback module, connected between the trigger signal terminal of the previous stage, the clock signal terminal and said first node, and connected to the feedback signal terminal of the present stage and the trigger signal terminal of the present stage; and
   a switch module, connected with the clock signal terminal, said feedback module and the output terminal of the present stage, and connected to the low level signal terminal;
   wherein said feedback module is used to receive a trigger signal of the feedback module of the previous stage and the clock signal, in order to pull up the level of the first node, and to output feedback signal to the shift register of the previous stage and output the trigger signal to the feedback module of the next stage, said switch module is used to maintain the output terminal of the shift register of the present stage at a low level when the shift register of the present stage does not operate.

2. The shift register as claimed in claim 1, wherein said feedback module comprises:
   a fourth thin film transistor, whose gate is connected to a first trigger signal terminal of the feedback module of the previous stage, a source thereof is connected to a gate of the fifth thin film transistor, a drain thereof is connected to a clock signal terminal;
   a fifth thin film transistor, whose gate is connected to the source of the fourth thin film transistor, a source thereof is connected to the first node, a drain thereof is connected to the second trigger signal terminal of the feedback module of the previous stage; and
   a sixth thin film transistor, whose gate is connected to the first node, a source thereof is connected to the clock signal terminal, a drain thereof is connected to a third node as a feedback node of the present stage.

3. The shift register as claimed in claim 2, wherein said switch module further comprises:
   class-1 switch module, which is used to control a first switch module, a second switch module and a third switch module, said class-1 switch module comprising: a seventh thin film transistor, whose gate and drain are connected together to the clock signal terminal, a source thereof is connected to the second switch module and the third switch module; a eighth thin film transistor, whose gate is connected to the clock signal terminal, a source thereof is connected to a fourth node as a interlocking node, a drain thereof is connected to the low level signal terminal; a ninth thin film transistor, whose gate and source are connected together to the clock signal terminal, a drain thereof is connected to the fourth node;
   the first switch module, used to maintain the output terminal of the present stage at a low level when the shift register of the present stage does not operate, which comprising: a tenth thin film transistor, whose gate is connected to the clock signal terminal, a source thereof is connected to the second node, a drain thereof is connected to the low level signal terminal; a eleventh thin film transistor, whose gate is connected to the fourth node, a source thereof is connected to the second node, a drain thereof is connected to the low level signal terminal;
   the second switch module, used to maintain said first node at a low level when the shift register of the present stage does not operate, which comprising: a twelfth thin film transistor, whose gate is connected to the source of the seventh thin film transistor, a source thereof is connected to the first node, a drain thereof is connected to the feedback module of the previous stage; a thirteenth thin film transistor, whose gate is connected to the fourth node, a source thereof is connected to the second node, a drain thereof is connected to the first node; and
   the third switch module, used to maintain said third node at a low level when the shift register of the present stage does not operate, which comprising: a fourteenth thin film transistor, whose gate is connected to the source of the seventh thin film transistor, a source thereof is connected to the third node, a drain thereof is connected to the low level signal terminal; a fifteenth thin film transistor, whose gate is connected to the fourth node, a source thereof is connected to the third node, a drain thereof is connected to the low level signal terminal.

4. The shift register as claimed in claim 2, further comprising: a seventeenth thin film transistor, whose gate is connected to the switch signal terminal, a source thereof is connected to the reset signal terminal, a drain thereof is connected to the second node.

5. The shift register as claimed in claim 2, further comprising: a sixteenth thin film transistor, whose gate is connected to the switch signal terminal, a source thereof is connected to the first node, a drain thereof is connected to the low level signal terminal.

6. The shift register as claimed in claim 3, further comprising: a sixteenth thin film transistor, whose gate is connected to the switch signal terminal, a source thereof is connected to the first node, a drain thereof is connected to the low level signal terminal.

7. The shift register as claimed in claim 3, further comprising: a seventeenth thin film transistor, whose gate is connected to the switch signal terminal, a source thereof is connected to the reset signal terminal, a drain thereof is connected to the second node.

8. The shift register as claimed in claim 1, further comprising: a sixteenth thin film transistor, whose gate is connected to the switch signal terminal, a source thereof is connected to the first node, a drain thereof is connected to the low level signal terminal.

9. The shift register as claimed in claim 1, further comprising: a seventeenth thin film transistor, whose gate is connected to the switch signal terminal, a source thereof is connected to the reset signal terminal, a drain thereof is connected to the second node.

10. A gate line driving device, comprising a plurality of shift registers connected in series, wherein said shift register comprises:
    a first thin film transistor, whose gate is connected to a first node as a pull-up node, a source thereof is connected to a clock signal terminal, a drain thereof is connected to a output terminal of the present stage;

a second thin film transistor, whose gate is connected to a feedback signal terminal of the next stage, a source thereof is connected to said first node, a drain thereof is connected to a low level signal terminal;

a third thin film transistor, whose gate is connected to a feedback signal terminal of the next stage, a source thereof is connected to a second node as a pull-down node, a drain thereof is connected to the low level signal terminal, wherein the second node is connected with the output terminal of the present stage;

a capacitor, connected between said first node and the output terminal of the present stage;

a feedback module, connected between the trigger signal terminal of the previous stage, the clock signal terminal and said first node, and connected to the feedback signal terminal of the present stage and the trigger signal terminal of the present stage; and a switch module, connected with the clock signal terminal, said feedback module and the output terminal of the present stage, and connected to the low level signal terminal;

wherein said feedback module is used to receive a trigger signal of the feedback module of the previous stage and the clock signal, in order to pull up the level of the first node, and to output feedback signal to the shift register of the previous stage and output the trigger signal to the feedback module of the next stage, said switch module is used to maintain the output terminal of the shift register of the present stage at a low level when the shift register of the present stage does not operate.

11. The gate line driving device as claimed in claim 10, wherein said feedback module comprises:

a fourth thin film transistor, whose gate is connected to a first trigger signal terminal of the feedback module of the previous stage, a source thereof is connected to a gate of the fifth thin film transistor, a drain thereof is connected to a clock signal terminal;

a fifth thin film transistor, whose gate is connected to the source of the fourth thin film transistor, a source thereof is connected to the first node, a drain thereof is connected to the second trigger signal terminal of the feedback module of the previous stage; and a sixth thin film transistor, whose gate is connected to the first node, a source thereof is connected to the clock signal terminal, a drain thereof is connected to a third node as a feedback node of the present stage.

12. The gate line driving device as claimed in claim 11, wherein said switch module comprises:

class-1 switch module, which is used to control a first switch module, a second switch module and a third switch module, said class-1 switch module comprising: a seventh thin film transistor, whose gate and drain are connected together to the clock signal terminal, a source thereof is connected to the second switch module and the third switch module; a eighth thin film transistor, whose gate is connected to the clock signal terminal, a source thereof is connected to a fourth node as a interlocking node, a drain thereof is connected to the low level signal terminal; a ninth thin film transistor, whose gate and source are connected together to the clock signal terminal, a drain thereof is connected to the fourth node;

the first switch module, used to maintain the output terminal of the present stage at a low level when the shift register of the present stage does not operate, which comprising: a tenth thin film transistor, whose gate is connected to the clock signal terminal, a source thereof is connected to the second node, a drain thereof is connected to the low level signal terminal; a eleventh thin film transistor, whose gate is connected to the fourth node, a source thereof is connected to the second node, a drain thereof is connected to the low level signal terminal;

the second switch module, used to maintain said first node at a low level when the shift register of the present stage does not operate, which comprising: a twelfth thin film transistor, whose gate is connected to the source of the seventh thin film transistor, a source thereof is connected to the first node, a drain thereof is connected to the feedback module of the previous stage; a thirteenth thin film transistor, whose gate is connected to the fourth node, a source thereof is connected to the second node, a drain thereof is connected to the first node;

the third switch module, used to maintain said third node at a low level when the shift register of the present stage does not operate, which comprising: a fourteenth thin film transistor, whose gate is connected to the source of the seventh thin film transistor, a source thereof is connected to the third node, a drain thereof is connected to the low level signal terminal; a fifteenth thin film transistor, whose gate is connected to the fourth node, a source thereof is connected to the third node, a drain thereof is connected to the low level signal terminal.

13. The gate line driving device as claimed in claim 11, wherein said shift register further comprises: a seventeenth thin film transistor, whose gate is connected to the switch signal terminal, a source thereof is connected to the reset signal terminal, a drain thereof is connected to the second node.

14. The gate line driving device as claimed in claim 11, wherein said shift register further comprises: a sixteenth thin film transistor, whose gate is connected to the switch signal terminal, a source thereof is connected to the first node, a drain thereof is connected to the low level signal terminal.

15. The gate line driving device as claimed in claim 12, wherein said shift register further comprises: a sixteenth thin film transistor, whose gate is connected to the switch signal terminal, a source thereof is connected to the first node, a drain thereof is connected to the low level signal terminal.

16. The gate line driving device as claimed in claim 12, wherein said shift register further comprises: a seventeenth thin film transistor, whose gate is connected to the switch signal terminal, a source thereof is connected to the reset signal terminal, a drain thereof is connected to the second node.

17. The gate line driving device as claimed in claim 10, wherein said shift register further comprises: a sixteenth thin film transistor, whose gate is connected to the switch signal terminal, a source thereof is connected to the first node, a drain thereof is connected to the low level signal terminal.

18. The gate line driving device as claimed in claim 10, wherein said shift register further comprises: a seventeenth thin film transistor, whose gate is connected to the switch signal terminal, a source thereof is connected to the reset signal terminal, a drain thereof is connected to the second node.

* * * * *